United States Patent
Takayanagi

(10) Patent No.: US 6,899,980 B2
(45) Date of Patent: May 31, 2005

(54) PHOTOMASK MATERIAL AND PROCESS OF PRODUCING PHOTOMASK FROM THE PHOTOMASK MATERIAL

(75) Inventor: Tkashi Takayanagi, Fujinomiya (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 235 days.

(21) Appl. No.: 10/259,577

(22) Filed: Sep. 30, 2002

(65) Prior Publication Data

US 2003/0091908 A1 May 15, 2003

(30) Foreign Application Priority Data

Sep. 28, 2001 (JP) ........................................ 2001-300948

(51) Int. Cl.⁷ ................................................ G03F 9/00
(52) U.S. Cl. ........................ 430/5; 430/270.1; 430/322; 430/323; 430/324
(58) Field of Search .................. 430/5, 270.1, 322–324

(56) References Cited

U.S. PATENT DOCUMENTS

2003/0129504 A1 * 7/2003 Wakata et al. .................. 430/5

* cited by examiner

*Primary Examiner*—Geraldine Letscher
(74) *Attorney, Agent, or Firm*—Young & Thompson

(57) ABSTRACT

A photomask material comprising a transmissive substrate and a photosensitive layer formed on a temporary substrate laminated on the transmissive substrate with the photosensitive layer faced to the transmissive substrate and a process of manufacturing a photomask from the photomask material is disclosed. The photosensitive layer is made of a composition comprising at least an alkali-soluble resin binder having a polymerizable unsaturated bond, a monomer having at least one polymerizable unsaturated bond, a photopolymerization initiator sensitive to light of a wavelength longer than 405 nm and a colorant surface-treated with a polymerizable dispersant.

36 Claims, 2 Drawing Sheets

PHOTOMASK MATERIAL AND PROCESS OF PRODUCING PHOTOMASK FROM THE PHOTOMASK MATERIAL

BACKGROUND OF THE INVENTION

1. Field of the Invention

The present invention relates to a photomask material for photomasks that are used in the photolithographic process widely used in the fields of flat panel displays such as PDPs, FEDs and LCDs, CRT shadow masks, printed circuit boards, packages, semiconductors, etc., and a process of manufacturing photomasks from the photomask material.

2. Description of Related Art

There have been known various types of photomasks, such as a Cr photomask with a chromium metal layer formed thereon, an Em photomask (emulsion photomask) with a silver halide emulsion layer formed thereon, that is used in the photolithographic process in the fields of flat panel displays, CRT shadow masks, printed circuits boards, semiconductors, etc. Such the photomasks are disclosed in "Photo Application," (published June, 1992 by Japan Photo Application Association, Education Branch), pages from 67 to 80. In the process of manufacturing the Cr photomask, a transparent substrate of, for example, quartz or glass with a chromium metal layer formed thereon using spattering and then is coated with an etching resist layer (photosensitive layer) over the chromium metal layer. After having exposed the etching resist layer to a given mask pattern with a HeCd laser of a wavelength of 442 nm and then developed the etching resist layer with, for example, an alkali solution, the chromium metal layer is etched so as thereby to reproduce the given mask pattern therein.

The inventor of this application has proposed in Japanese Patent Application No. 2000-163272, now open to the public as Japanese Unexamined Patent Publication No. 2001-343734, a photomask having a photosensitive layer sensitive to near-ultraviolet radiations or visible light. This photomask is easy of defect correction, better balanced in sensitivity and resolution, inexpensive in production, and less load on the environment in addition to having no necessity of having a metal layer. The photosensitive layer has the property of absorption that, while the photosensitive layer is, on one hand, low in absorbency in near-ultraviolet and visible regions before exposure and development in the process of manufacturing the photomask and the photosensitive layer after exposure and development absorbs light in the ultraviolet region adequately when the potomask is used.

Since exposing and developing the photosensitive layer is the unavoidable step in any process of manufacturing the photomask, in order for the photomask to be high in resolution and quality, the photosensitive layer has the necessity of having high sensitivity, mechanical strength and hardness, and satisfactory solvent resistance.

There have been know a variety of photosensitive materials. An example of such a photosensitive material is a colored pigment dispersed-radiation sensitive composition that is used for manufacturing color filters for liquid crystal display devices and solid-state image sensing devices, as disclosed in, for example, Japanese Unexamined Patent Publication No. 10-20496. This colored pigment dispersed-radiation sensitive composition, that is characterized in that a binding resin comprises a copolymers of an allyl acrylate monomer or an allyl methacrylate monomer and a monomer having an acid a group, has high sensitivity and large developing latitude and is excellent in adhesion. However, the colored pigment dispersed-radiation sensitive composition is intended for manufacturing color filters and is not applicable to manufacturing photomasks. In addition, since the colored pigment dispersed-radiation sensitive composition is not sensitive to light in the near-ultraviolet and visible regions, it is impossible to employ the pigment dispersed-radiation sensitive composition as the photosensitive layer of the photomask material indispensably sensitive to laser light in the near-ultraviolet and visible regions that have high radiation energy.

An example of an etching resist used for black matrices is a composition disclosed in, for example, Japanese Unexamined Patent Publication No. 10-39502 that consists of a binder resin, a compound having a specific chemical structure of ethylenically double bond, a photopolymerization initiator and a pigment. Since the binder resin is incapable of polymerizing and, in consequence, a layer of the etching resist is low in mechanical strength, there is the problem that exposed regions of the etching resist layer possibly swells as it is developed. This is conductive to a deterioration in the resolution of matrix. In addition, since the composition absorbs light in the near-ultraviolet and visible regions, it is impossible to employ the composition for an etching resists for a photosensitive layer indispensably sensitive to laser light in the near-ultraviolet and visible regions.

An example of a photo resist material used for colored filters is a composition disclosed in, for example, Japanese Unexamined Patent Publication No. 10-55064 that consists of a binder resin with a molecular weight distribution Mw/Mn of from 2.0 to 5.0, a compound with a specific chemical structure of ethylenically double bond, a photopolymerization initiator and a pigment. This composition has the same problems as the etching resist exemplified above.

An example of a colored photosensitive material used for color filters is a composition disclosed in, for example, Japanese Unexamined Patent Publication No. 7-98409 that employs a resin having an ethylenically double bond and a fluorine ring as a pigment dispersed resin. A photosensitive layer made of the colored photosensitive composition has high sensitivity to light for exposure even though it has no oxygen blocking layer operative to block off oxygen counteract photopolymerization. This colored photosensitive composition is not only unsuited for photosensitive transfer materials because the colored photosensitive composition has strong adhesion and is, in consequence, hard to be turned into a film, but also excludes laser light in the visible region from the use of exposure because the colored photosensitive composition is not sufficiently sensitive to laser light in the visible region.

SUMMARY OF THE INVENTION

It is an object of the present invention to provide a photomask material having a photosensitive layer that has sufficiently sensitive to light of a wavelength longer than 405 nm in addition to having high sensitivity, high mechanical strength and hardness, and good solvent resistance.

It is another object of the present invention to provide a process of manufacturing a photomask from a photomask material that has sufficiently sensitive to light of a wavelength longer than 405 nm in addition to having high sensitivity, high mechanical strength and hardness, and good solvent resistance.

According to one aspect of the present invention, the above object is achieved by a photosensitive transfer material comprising a photosensitive layer formed over a temporary substrate. The photosensitive layer contains at least an alkali-soluble resin binder having a polymerizable unsaturated bond, a monomer having at least one polymerizable unsaturated bond, a photopolymerization initiator system sensitive to light of a wavelength longer than 405 nm and a colorant surface-treated with a polymerizable dispersant that is desirably alkali-soluble. The temporary substrate may be formed with an under coating layer containing an alkali-soluble resin.

The photosensitive layer after exposure and development has a high absorbency in a specific range of wavelengths, more specifically, desirably an absorbency higher than 2.5 in a range of wavelengths shorter than 405 nm, more desirably higher than 3 in a range of wavelengths shorter than 380 nm. Further, the photosensitive layer before exposure and development is sensitive to a light in a range of wavelengths longer than 440 nm and desirably has an absorbency lower than 2.4 in a range of wavelengths longer than 480 nm.

The polymerization initiator system may contain a sensitizing dye capable of absorbing a laser of a wavelength longer than 405 nm.

According to another aspect of the present invention, the above object is achieved by a photomask material comprising a transmissive substrate and the photosensitive transfer material described above that is laminated over the transmissive substrate with the photosensitive layer faced to the transmissive substrate.

The photomask material may further comprises a light blocking layer formed on the transmissive substrate so as to face to the photosensitive layer.

According to still another aspect of the present invention, the above object is achieved by a photomask having at least a light blocking layer formed on a transmissive substrate, the light blocking layer comprising a photosensitive layer that comprises at least an alkali-soluble resin binder having polymerizable unsaturated bonds, a monomer having at least one polymerizable unsaturated bond, an photopolymerization initiator system sensitive to a light of a wavelength longer than 405 nm and a colorant surface-treated with a polymerizable dispersant and has been exposed to a light of a wavelength longer than 405 nm and then developed.

The photosensitive layer after exposure and development desirably has a high absorbency in a specific range of wavelengths, specifically, an absorbency higher than 2.5 in a range of wavelengths shorter than 405 nm, more desirably higher than 3 for light in a range of wavelengths shorter than 380 nm. Further, the photosensitive layer before exposure and development is sensitive to light in a range of wavelengths longer than 440 nm and desirably has an absorbency lower than 2.4 in a range of wavelengths longer than 480 nm. The polymerization initiator system may contain a sensitizing dye capable of absorbing laser light of a wavelength longer than 405 nm.

The photomask may comprises at least a light blocking layer such as a metal layer and a protective layer formed in this order on a transmissive substrate. The protective layer comprises a photosensitive layer having been exposed to light of a wavelength longer than 405 nm and then developed, wherein the photosensitive layer contains at least an alkali-soluble resin binder having polymerizable unsaturated bonds, a monomer having at least one polymerizable unsaturated bond, an photopolymerization initiator system sensitive to light of a wavelength longer than 405 nm and a colorant surface-treated with a polymerizable dispersant. The photosensitive transfer material is laminated over the transmissive substrate with the photosensitive layer faced to the transmissive substrate.

The photosensitive layer after exposure and development desirably has a high absorbency in a specific range of wavelengths, specifically, an absorbency higher than 2.5 in a range of wavelengths shorter than 405 nm, more desirably higher than 3 in a range of wavelengths shorter than 380 nm. Further, the photosensitive layer before exposure and development is sensitive to light in a range of wavelengths longer than 440 nm and desirably has an absorbency lower than 2.4 in a range of wavelengths longer than 480 nm. The polymerization initiator system may contain a sensitizing dye capable of absorbing laser light of a wavelength longer than 405 nm.

According to still another aspect of the present invention, the above object is achieved by a process comprising at least the steps of laminating a photosensitive transfer material having a photosensitive layer on the temporary substrate described above over a transmissive substrate with the photosensitive layer faced to the transmissive substrate so as to transfer the photosensitive layer to the transmissive substrate, peeling the temporary substrate, and exposing the photosensitive layer to light, desirably laser light, of a wavelength longer than 405 nm, and then developing the photosensitive layer in this order.

Otherwise, the process may perform the step of exposing the photosensitive layer to light of a wavelength longer than 405 nm through the temporary substrate after the step of laminating the photosensitive transfer material over the transmissive substrate with the photosensitive layer faced to the transmissive substrate so as to transfer the photosensitive layer to the transmissive substrate and the step of developing the photosensitive layer after the step of peeling the temporary substrate.

The process may further comprise the step of heating the photosensitive layer after development at a temperature from approximately 120° C. to approximately 250° C.

BRIEF DESCRIPTION OF THE DRAWINGS

The above and other objects of the present invention will be fully understood from the following description of the embodiments thereof when reading in conjunction with the accompanying drawings, in which.

DETAILED DESCRIPTION OF THE INVENTION

Figure 1:
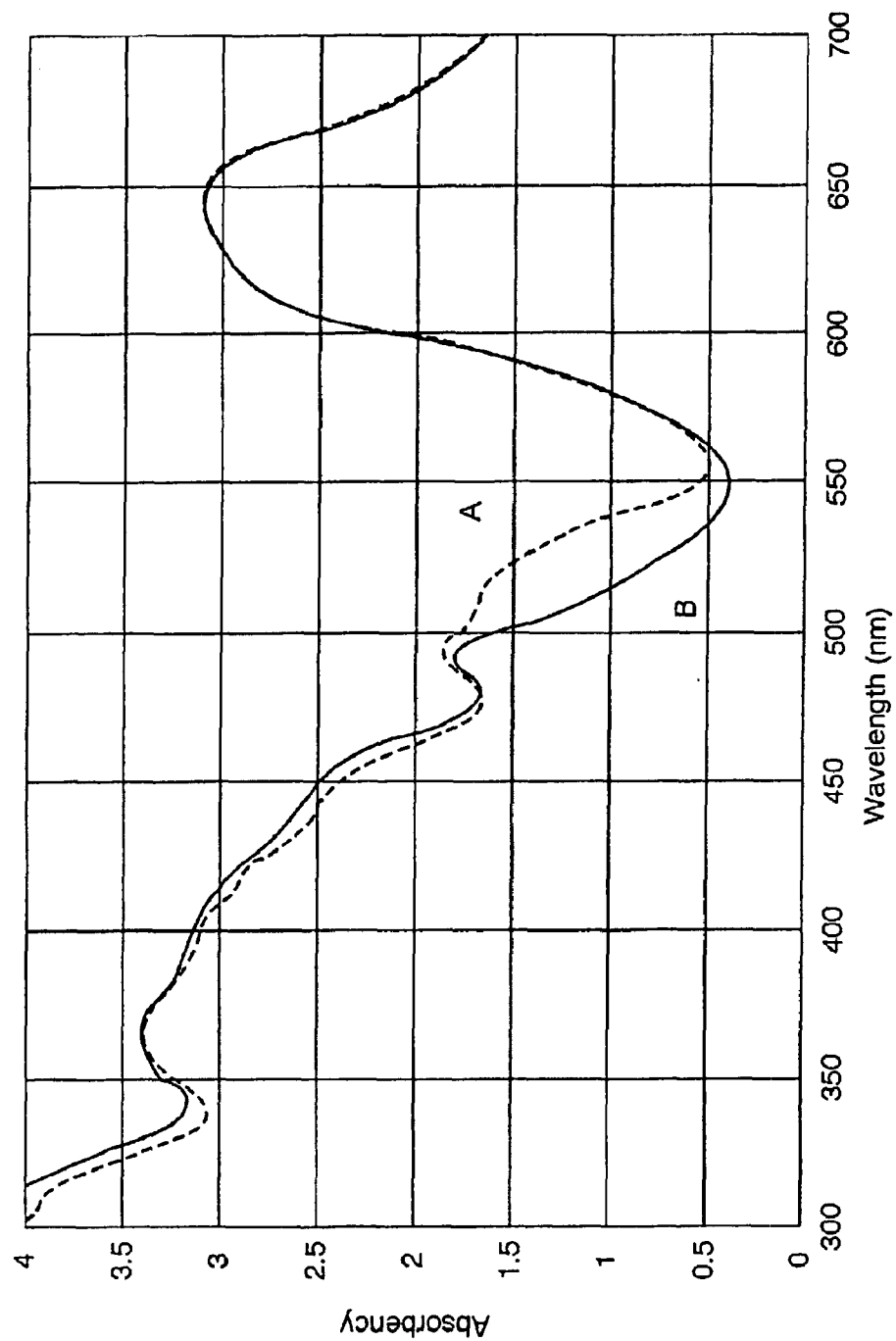
FIG. 1 is graphic representation of absorbency of a photosensitive layer of a photomask material according to an embodiment of the present invention and absorbency of a photomask according to an embodiment of the present invention.

In the following description directed to a photosensitive transfer material, a photomask material made of the photosensitive transfer material, a photomask made of the photomask material and a process of manufacturing the photomask, the term "one over the other" used in connection with a relative positional relation between two or more layers shall not always mean and refer to the position relation in which they are in contact with one another but to the positional relation which one layer is positioned above another layer.

A photosensitive composition for a photosensitive layer basically comprises: (i) an alkali-soluble resin binder having a polymerizable unsaturated bond; (ii) a monomer having at least one polymerizable unsaturated bond; (iii) a polymerization initiator system sensitive to light of a wavelength greater than 405 nm; and (iv) a colorant surface-treated with a polymerizable dispersant. The photosensitive transfer material comprising a photosensitive layer made of the photosensitive composition described above shows comparatively high mechanical strength and hardness after curing and solidification satisfies its demand for high solvent resistance. In addition, because of high sensitivity to light in the visible region, the photosensitive layer enables laser light in the visible region that have higher exposure energy to be employed.

The photosensitive composition for the photosensitive layer of the photosensitive transfer material will be described by component below.

(i) Alkali-Soluble Resin Binder Having Polymerizable Unsaturated Bond

No limitation is imposed on resins for the alkali-soluble resin binder inasmuch as the resin has an unsaturated bond polymerizable with an acidic functional group in a molecule. Examples of such a resin are a copolymer consisting of a monomer with an acid functional group and a monomer having a polymerizable unsaturated bond in addition to an unsaturated bond necessary to polymerize as a monomer or a copolymer of the above mentioned monomers and a monomer that neither has an acid functional group nor a polymerizable unsaturated bond. Citing examples, there are acid-groups such as a carboxyl group, a phenolic hydroxyl group, etc., and a variety of monomers having an acid functional group such as an acrylic acid, a methacrylic acid, hydroxy styrene, etc. Further, as the polymerizable unsaturated bond, there are exemplified an unsaturated bond such as an allyl group, an unsaturated bond such as a cinnamyl group, an unsaturated bond such as a crotyl group, etc. Monomers having one of these groups include, for example, allyl acrytlate, allyl methacrylate, cinnamyl acrytlate, cinnamyl methacrytlate, crotyl acrytlate, crotyl methacrytlate, etc. Monomers neither having an acid functional group nor having a polymerizable unsaturated bond include, for example, styrene, acrylic ester, methacrylic ester, etc.

The copolymer suitable for the alkali-soluble resin binder preferably comprises desirably 2% to 50 mol % of, and more desirably 15% to 40 mol % of, the acid group-bearing monomer and desirably 10% to 90 mol % of, and more desirably 30% to 70 mol % of, the monomer having a polymerizable unsaturated bond and has a weight average molecular weight (Mw) desirably between 2000 and 200000, and more desirably between 4000 and 120000.

Citing examples of the copolymer for the alkali-soluble resin binder, for purposes of exemplification and not limitation, there are a number of bipolymers such as a methacrylic acid/allyl methacrylate copolymer, an acrylic acid/allyl methacrylate copolymer, a methacrylic acid/allyl acrylate copolymer, an acrylic acid/allyl acrylate copolymer, a hydroxy styrene/allyl methacrylate copolymer, a hydroxy styrene/allyl acrylate copolymer, an acrylic acid/cinnamyl methacrylate copolymer, a methacrylic acid/cinnamyl methacrylate copolymer, an acrylic acid/crotyl methacrytlate copolymer, a methacrylic acid/crotyl methacrytlate copolymer, etc. Further, there are a number of terpolymers employable as the alkali-soluble resin binder such as a methacrylic acid/benzyl methacrylate/allyl methacrylate copolymer, a methacrylic acid/benzyl methacrylate/allyl acrylate copolymer, an acrylic acid/benzyl methacrylate/allyl methacrylate copolymer, an acrylic acid/benzyl methacrylate/allyl acrylate copolymer, a methacrylic acid/benzyl acrylate/allyl methacrylate copolymer, a methacryl acid/benzyl acrylate/allyl acrylate copolymer, an acrylic acid/benzyl acrylate/allyl methacrylate copolymer, an acrylic acid/benzyl acrylate/allyl acrylate copolymer, a hydroxy styrene/benzyl methacrylate/allyl methacrylate copolymer, a hydroxy styrene/benzyl acrylate/allyl methacrylate copolymer, a hydroxy styrene/benzyl methacrylate/allyl acrylate copolymer, a hydroxy styrene/benzyle acrylate/allyl acrylate copolymer, a methacrylic acid/styrene/allyl methacrylate copolymer, a methacrylic acid/styrene/allyl acrytlate copolymer, an acrylic acid/styrene/allyl methacrylate copolymer, an acrylic acid/styrene/allyl acrylate copolymer, etc.

Further, resins such as known from, for example, a description from paragraph [0015] to paragraph [0032] of Japanese Unexamined Patent Publication No. 10-20496 are employable as the alkali-soluble resin binder having a polymerizable unsaturated bond.

(ii) Monomer Having at Least One Polymerizable Unsaturated Bond

Employable as the monomers having at least one polymerizable unsaturated bond are, for example, acrylic esters of monohydraulic or polyhydraulic alcohol and methacrylic esters of monohydraulic or polyhydraulic alcohol.

Citing examples of monohydraulic alcohol for purposes of exemplification and not limitation, there are a variety of methanol, ethanol, propanol, isopropanol, n-butanol, isobutanol, t-butanol, cyclohexyl alcohol, benzyl alcohol, octyl alcohol, 2-ethyl hexanol, lauryl alcohol, n-decanol, undecanol, cetyl alcohol, stearyl alcohol, methoxyethyl alcohol, ethoxyethyl alcohol, butoxyethyl alcohol, polyethylene glycol monomethyl ether, polyethylene glycol monoethyl ether, 2-hydroxy-3-chloropropane, dimethylamino ethyl alcohol, diethylamino ethyl alcohol, glycidol, 2-trimethoxy silyl ethanol, ethylene chlorohydrin, ethylene bromohydrin, 2,3-dibrom propanol, allyl alcohol, oleyl alcohol, epoxy stearyl alcohol, phenol, naphthol, etc.

Citing examples of polyhydraulic alcohol for purposes of exemplification and not limitation, there are ethylene glycol, 1,2-propanediol, 1,3-propanediol, 1,4-butanediol, 1,5-pentanediol, hexanediol, heptanediol, octanediol, nonanediol, dodecanediol, neopentyl glycol, 1,10-decandiol, 2-butene-1,4-diol, 2-n-butyl-2-ethyl-propanediol, cycloheptanediol, 1,4-cyclohexane dimethanol, 3-cyclohexene-1, 1-diethanol, polyethylene glycol (diethylene glycol, triethylene glycol, etc.), polypropylene glycol (dipropylene glycol, tripropylene glycol, etc.), polystyrene oxide glycol, polytetrahydrofuran glycol, xylylenediol, bis(β-hydroxyethoxy)benzene, 3-chlor-1,2-propanediol, 2-2-dimethyl-1,3-propanediol, 2,2-diethyl-1,3-propanediol, 2,2-diphenyl-1,3-propanediol, decalindiol, 1,5-dihydroxy-1,2,3,4-tetrahydronaphtalene, 2,5-dimethyl-2,5-hexanediol, 2-ethyl-1,3-hexanediol, 2-ethyl-2-(hydroxymethyl)-1,3-propanediol, 2-ethyl-2-methyl-1,3-propanediol, 3-hexene-2,5-diol, hydroxy-benzyl alcohol, 2-methyl-1,4-butanediol, 2-methyl-2,4-pentanediol, 1-phenyl-1,2-ethanediol, 2,2,4,4-tetra-methyl-1,3-cyclobutanediol, 2,3,5,6-tetramethyl-p-xylene-α,α'-diol, 1,1,4,4-tetraphenyl-2-butyne 1,4-diol, 1,1'-bi-2-naphthol, dihydroxy-naphthalene, 1,1'-methylene-di-2-naphthol, bi-phenol, 2,2-bis(4-hydroxy-phenyl) cyclohexane, bis (hydroxyphenyl)methane, catechol, resorcinol, 2-methylresorcinol, 4-chlororesorcinol, pyrogallol, α-(1-aminoethyl)-p-hydroxybenzyl alcohol, 2-amino-2-methyl-1,3-propanediol, 2-amino-2-ethyl-1,3-propanediol, 3-amino-1,2-propanediol, N-(3-aminopropyl)-diethanolamine, N,N-bis (2-hydroxyethyl)piperazine, 1,3-bis(hydroxy-methyl)urea, 1,2-bis(4-pyridyl)-1,2-ethanediol, N-n-butyl diethanolamine, diethanol-amine, N-ethyl diethanolamine, 3-mercapto-1,2-propanediol, 3-piperidine-1,2-propanediol, 2-(2-pyridyl)-1,3-propanediol, glycerin, trimethylol ethane, tri-methylol propane, pentaerythritol, dipentaerythritol, tripentaerythritol, sorbitol, glucose, α-mannitol, butanetriol, 1,2,6-trihydroxyhexane, benzenetriol, triethanolamine, 2,2-bis (hydroxymethyl)-2,2', 2"-nitrylo nitrilotriethanol, etc.

Preferable examples of acrylic ester of the monohydraulic alcohol or the polyhydraulic alcohol and methacrylic ester of the monohydraulic alcohol or the polyhydraulic alcohol include ethylene glycol diacrylate, ethylene glycol dimethacrylate, polyethylene glycol diacrylate, polyethylene glycol dimethacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, dipentaerythritol pentaacrylate, dipentaerythritol pentamethacrylate, glycerin triacrylate, glycerin trimethacrylate, trimethylpropane triacrylate, trimethylpropane trimethacrylate, trimethylolethane triacrylate, trimethylolethane trimethacrylate, neopentylglycol diacrylate, neopentylglycol dimethacrylate, sorbitol hexaacrylate, sorbitol hexamethacrylate, sorbitol pentaacrylate, sorbitol pentamethacrylate), etc.

In addition, acrylamide of monoamine or polyamine and methacrylamide of monoamine or polyamine can be employed as the monomer having at least one polymerizable unsaturated bond. Examples of monoamine include, for example, monoalkylamine such as ethylamine, butylamine, aminoamine, hexylamine, octylamine, cyclohexylamine, 9-aminodecalin, etc., monoalkenylamine such as allylamine, metallylamine, benzylamine, etc., and aromatic amine such as aniline, toluidine, p-aminostyrene, etc. Examples of polyamines include, for example, ethylenediamine, trimethylenediamine, tetramethylenediamine, hexamethylenediamine, octamethylenediamine, hexamethylene-bis(2-aminopropyl)amine, diethyltriamine, triethylenetetramine, polyethylenepolyamine, tris(2-aminoethyl)amine, 4,4'-methylene (aminocyclohexane), N,N'-bis(2-aminoethyl)amine, 4,4'-methylene-bis (aminocyclo-hexane), N,N'-bis (2-aminoethyl)-1,3-propanediamine, N,N'-bis(3-aminopropyl)-1,4-butanediamine, N,N'-bis(3-aminopropyl) ethylenediamine, N,N'-bis(3-amino-propyl) -1,3-propane-diamine, 1,3-cyclohexane-bis(methylamine), phenylenediamine, xylylenediamine, β-(4-aminophenyl)ethylamine, diamino-toluene, diaminoanthracene, diamino-naphthalene, diaminostyrene, methylenedianiline, 2,4-bis(4-aminobenzyl)aniline, aminophenile ether, etc.

Further, employable are allyl compounds such as mono- or poly-allyl ester of mono- or poly-calboxylic acid including formic acid, acetic acid, propionic acid, butyric acid, lauric acid, benzoic acid, chrolbenzoic acid, malonic acid, oxalic acid, glutaric acid, adipic acid, sebacic acid, phthalic acid, terephthalic acid, hexa-hydrophthalic acid, chlorendic acid, trimellitic acid, etc., mono- or poly-allyl ester of mono- or poly-sulfonic acid including benxen disulfolic acid, naphthalene disulfonic acid, etc., diallylamine, N,N'-diallyl oxalic acid, 1,3-diallyl urea, diallyl ether, triallyl isocyanurate, etc.

Still further, employable are polyvinyl compounds such as divinyl benzene, p-allyl styrene, p-isopropenyl styrene, divinyl sulfone, ethylene glycol divinyl ether, glycerol trivinyl ether, divinyl phthalate, divinyl terephthalate, etc, and ester compounds of acrylic acid having an ionic group or methacrylic acid having an ionic group such as 2-hydroxy-3-methacryroil oxypropyl trimethyl ammonium chrolide, methacryroil oxyphenyl trimethyl ammonium chrolide, etc.

Examples of commercially available polymerizable monomers or oligomers employable as the monomer having at least one polymerizable unsaturated bond are acrylate monomers such as ARONIX M5700, ARONIX M6100, ARONIX M8030, ARONIX M152, ARONIX M205, ARONIX M215, ARONIX M315 and ARONIX M325 (distributed by Toa Gosei Co., Ltd.), acrylate monomers or theacrylate monomers such as NK Ester ABPE-4, NK Ester U-4HA, NK ESTER CB-1, NK ESTER CBX-1 (distributed by Shin-Nakamura Chemical Co., Ltd.), KAYARAD R604, KAYARAD DPCA-30, KAYARAD DPCA-30, KAYAMER PM-1 and KAYAMER PM-2 (distributed by Nippon Kayaku Co., Ltd.), acrylate monomers or methacrylate monomers such as Photomer 4061 and Photomer 5007 (distributed by Sannopuko Co., Ltd.).

Each of these monomers can be used by itself or may be used in combination with any one or more of them. The monomer or monomers can be added desirably in a range from approximately 5% to approximately 100% by weight content, more desirably in a range from approximately 10% to approximately 70% by weight content, relative to the solid content of the photosensitive layer.

(iii) Polymerzation Initiator System Sensitive to Light of Wavelength of Greater Than 405 nm It is desirable for the polymerization initiator system for initiating photopolymerization to contain a sensitizing dye and a polymerization initiator that absorbs laser light of a wavelength longer than 405 nm. Examples of a sensitizing dye and a polymerization initiator are sensitizing dyes and radical polymerization initiators comprising titanocen compounds such as known from, for example, the descriptions from paragraph [0052] to paragraph [0100] and from paragraph [0101] to paragraph [0104], respectively, of Japanese Unexamined Patent Publication No.8-334897, respectively. Compounds such as known from, for example, the description from paragraph [0105] to paragraph [0182] of Japanese Unexamined Patent Publication No.8-334897 can be used as an auxiliary agent for amelioration of sensitivity of the polymerization initiator. Further, oxime ether compounds such as known from, for example, the description from paragraph [0016] to phrase [0080] of Japanese Unexamined Patent Publication No.8-202035 can be used to increase polymerization velocity.

(iv) Colorant Surface-treated with Polymerizable Dispersanr

A polymerizable dispersant shows an ability in dispersing a pigment and has a polimerizable unsaturated bond. Such the polymerizable dispersant is desirable to have an acid group. The alkali-soluble resin binder described above that has a polymerizable unsaturated bond can be use for the polymerizable dispersant. A polymerizable dispersant having no unsaturated bond may be used in combination with the polymerizable dispersant having a polymerizable unsaturated bond. It is preferable for the colorant to have not significant absorption for light in the range of wavelengths longer than 405 nm. Examples of such a colorant include a blue pigment, a green pigment, an yellow pigment, a violet pigment and the like. Each of these pigments may be used by itself. The blue and yellow pigments can be used in combination. Further, colorants that can be contained in a photosensitive layer of the photosensitive transfer material doubling as a light blocking layer which will be described later may be employed.

(Other Components)

In order for the photosensitive transfer material to have an improved cured strength, the photosensitive composition may additionally comprise an alkali-insoluble polymer such as an epoxy resin, a melamine resin, etc. in the compass of having almost no adverse effects on development. The alkali-insoluble polymer content is desirably between approximately 0.2% and approximately 50% in weight, and more desirably between approximately 1% and approximately 30% in weight, relatively to the solid content of the photosensitive composition. If the alkali insoluble polymer content is below 0.2%, the photosensitive layer does not show a raise in cured strength. On the other hand, if the alkali insoluble polymer content is above 50%, the photosensitive layer shows a raise in cured strength but encounters a deterioration in adaptability to development.

In order for the photosensitive composition to have an improved absorbency in the ultraviolet region, the photosensitive composition may additionally comprise an additive such as ultraviolet absorption agents, metals and metal oxides for example a titanium oxide. One of the ultraviolet absorption agents is a compound such as disclosed in, for example, Japanese Unexamined Patent Publication No.9-25360 that shows a high absorbency in the ultraviolet region as a result of thermal treatment.

It is further preferable for the photosensitive composition to contain a thermal polymeriztion inhibiter as an additive such as hydrochinone, p-methoxyphenol, di-t-butyl-p-cresol, pyrogallol, t-butylcatechol, benzoquinone, 4,4'-thio-bis(3-methyl-6-t-butylphenol), 2,2'-methylene-bis(4-methyl-6-t-butylphenol), 2-mercapto benz-imidazole, phenothiazine, etc.

The photosensitive composition may further contain known additives such as a plasticizing agent and/or a surface active agent as needed.

In the case where the photosensitive transfer material is used to fabricate photomasks, the photosensitive layer of the photosensitive transfer material after exposure and development can be made double as a light blocking layer by using the photosensitive composition adjusted to be sensitive to light of a wavelength greater than 405 nm and having a high absorbency in the range of wavelengths of light to be blocked off. Therefore, though it is desirable for the photosensitive layer before exposure to show a comparatively weak absorbency in the range of wavelengths of light for exposure, the photosensitive layer is not always necessary to be weak in absorbency in that range of wavelengths of light for exposure inasmuch as the light has intensity sufficiently high to expose the photosensitive layer and cause sufficient photopolymerization of the photosensitive layer as will be described later. The absorbency of the photosensitive layer for blocking off light is desirably above approximately 1.05, more desirably above approximately 2.5, and most desirably above approximately 3. In order for the photosensitive layer to have an absorbency from approximately 1.05 to approximately 3, it is effective to add a colorant having a high absorbency in that range of wavelengths into the photosensitive composition. Since the absorbency of the photosensitive layer depends not only upon the type of colorant but also upon a colorant content and a thickness of the photosensitive layer, in order to realize a desired absorbency of the photosensitive layer, it is necessary to take these factors into consideration.

The light that are to be blocked off include light from a high-pressure mercury lamp installed into an exposure apparatus such as an aligner. In this case, the photosensitive layer has the necessity of having high absorbencies for a g-line of 435 nm, an h-line of 404 nm and an i-line of 365 nm. On the other hand, the light for exposure is desirable to have a wavelength longer than 405 nm. In this point of view, an especially preferable example of the light for exposure is laser light such as ND-YAG laser light (532 nm), Ar ion laser light (413 nm), HeCd laser light (442 nm) or Kr ion laser light (413 nm) but is not exclusive to them.

Further, it is desirable for the photosensitive layer to have a low absorbency in that range of wavelengths of light for exposure in view of efficient photopolymerization of the entire area of the photosensitive layer. The absorbency in this instance is desirably below approximately 2.4, more desirably below approximately 2.0, and most desirably below approximately 1.0. In the case of Ar-ion laser of 488 nm or ND-YAG laser of 532 nm that is comparatively low in intensity, it is desirable for the photosensitive layer to have a low absorbency in the range of wavelengths at least longer than 480 nm, in particular between 488 nm and 532 nm.

In the case of making a photomask using a photosensitive transfer material having the photosensitive layer describe above, the light used for exposure of the photosensitive layer that has a wavelength greater than 405 nm, on one hand, attains deep penetration into the photosensitive layer and is, in consequence, sufficiently high in intensity even within a short period of time without being increased in photo energy and, on the other hand, satisfactorily absorbs light that are to be blocked when operates as a light blocking layer. Accordingly, in addition to that the photomask made of the photosensitive transfer material functions satisfactorily as required, while the photomask made of the photosensitive transfer material has high sensitivity, the light blocking layer, i.e. the photosensitive layer having the composition described above, of the photomask excels in mechanical strength.

In the case of using other types of laser light for exposure such as, for example, Kr-ion laser of 413 nm and HeCd laser of 442 nm, although the laser light is absorbed at a bit higher ratio by the photosensitive layer, it has proper intensity, and, in consequence, it is not necessary to change the absorbency of the photosensitive layer. Therefore, the absorbency of the light blocking layer, and hence the photosensitive layer, for light for exposure can be appropriately determined in consideration of a sensitivity of the light blocking layer, i.e. the photosensitive layer.

Examples of a photosensitive layer that can double as a light blocking layer are one having a high absorbency in a range of wavelengths shorter than 405 nm, one having a high absorbency in a range of wavelengths shorter than 380 nm and an appropriate sensitivity to light in a range of wavelengths longer than 440 nm, and one having an absorbency greater than approximately 3 in a range of wavelengths shorter than 380 nm and less than 2.4 in a range of wavelengths longer than 480 nm.

In order to gain the photosensitive layer having the above peculiarities, it is preferable that the photosensitive layer contains a colorant having an absorbency smaller in a range of wavelengths longer than 405 nm than in a range of wavelengths of light to be blocked off. However, as was previously described, there are some cases where it is not necessary for the photosensitive layer to have a low absorbency according to wavelengths of some types of laser light. It is also desirable for the photosensitive layer to contain an ultraviolet absorption agent with an intention to enhance its absorbency of ultraviolet light if light to be blocked off contain ultraviolet light.

An example of a colorant is a carbon black. While the carbon black can be used by itself, it may be used in combination with a dye of blue, green, red, yellow or violet or a pigment of blue, green, red, yellow or violet. In order fort he photosensitive layer to acquire a more enhanced sensitivity, it is desirable to employ a pigment that has a low absorbency in a range of wavelengths of laser light used to expose the photosensitive layer during making a photomask, for example laser light having a wavelength of 488 nm or 532 nm that is in the visible region of wavelength and has a high absorbency for light used to project the mask pattern in, for example, the ultraviolet region of wavelength. For example, the green pigment can be used by itself or may be used in combination with the yellow pigment.

Examples of the green and yellow pigments are victoria, pure blue BO (C.I.42595), oramine (C.I.41000), fat black HB (C.I.26150), monolight yellow GT (C.I. pigment yellow 12), permanent yellow GR (C.I. pigment yellow 17), permanent yellow HR (C.I. pigment yellow 83), permanent carmine FBB (C.I. pigment red 146), hostaperm red ESB (C.I. pigment violet 19), permanent ruby FBH (C.I. pigment red 11), fastel pink B sputa (C.I. pigment red 81), monastral first blue (C.I. pigment blue 15), monastral first black B (C.I. pigment black 1), carbon, C.I. pigment red 97, C.I. pigment red 122, C.I. pigment red 149, C.I. pigment red 68, C.I. pigment red 177, C.I. pigment red 180, C.I. pigment red 192, C.I. pigment red 215, C.I. pigment green 7, C.I. pigment green 36, C.I. pigment blue 15:1, C.I. pigment blue 15:4, C.I. pigment blue 15:6, C.I. pigment blue 22, C.I. pigment blue 60, C.I. pigment blue 64, etc.

In the case where the light blocking layer comprises a metal layer, the photosensitive layer may be left laid over the metal layer so as to work as a protective layer toward the metal layer. Since the cured and solidified photosensitive layer (protective layer) has high mechanical strength and favorable solvent resistance, the photosensitive layer protects the metal layer during a cleaning process and makes a contribution to reducing the number of pinholes formed in the metal layer.

When leaving the photosensitive layer as the protective layer, the photosensitive layer after photopolymerization is preferred to have a low reflectance to light in a range of wavelengths shorter than 440 nm in addition to being made of the above described resin composition. The reflectance of the photosensitive layer after photopolymerization is desirably below approximately 35%. Examples of the colorant that is to be contained in the photosensitive layer having such the reflectance are such as capable of absorbing light in a region of wavelengths shorter than, for example, 440 nm or having its absorbency, for example, greater than approximately 1.05, and, however, capable of insecurely absorbing light in a region of wavelengths longer than, for example, 480 nm or having its absorbency, for example, less than approximately 1.0. In this instance, since the colorant contained in the photosensitive layer has a low absorbency for light that is used to expose the photosensitive layer during making a photomask, the colorant has no adverse effect on exposure and development of the photosensitive layer during making the photomask. Further, since the photosensitive layer with the colorant contained has the low reflectance to light in the range of wavelengths shorter than 44 nm that is used to project the mask pattern, the photosensitive layer can have enhanced sensitivity when used as a photomask.

Examples of the colorant are a blue pigment and a green pigment. While the blue pigment or the green pigment can be used by itself, they may be used in combination with an yellow pigment. Further, the same colorants as used for the photosensitive layer doubling as a light blocking layer may be employed. The colorant content relatively to the solid content of the photosensitive composition for the photosensitive layer is determined in consideration with concentration of a photomask and sensitivity and resolution of the photosensitive layer used to make the photomask and is generally between approximately 10% and approximately 50% in weight, and more preferably between approximately 15% and approximately 35% in weight, according to colorant.

Base members employed as a temporary substrate for the photomask material include a thin sheet of teflon (R), polyethylene terephthalate, polycarbonate, polyethylene, polypropylene or a lamination of two or more of them. Such a base sheet or a base lamination is desirably between approximately 5 $\mu$m and approximately 300 $\mu$m in thickness, and more desirably between approximately 20 $\mu$m and approximately 150 $\mu$m in thickness. In the case where exposure is made through the temporary substrate, the base sheet or the base lamination is necessary to be light transmissive. The temporary substrate is desirably provided with an under coating layer, monolayer or bilayer, containing an alkali-soluble resin. The under coating layer works as a protective layer, an oxygen blocking layer, a peeling layer or the like. The alkali-soluble resin includes polymers having a carboxylic acid group in a lateral chain such as, for example, a methacrylic acid copolymer, an acrylic acid copolymer, an itaconic acid copolymer, a crotonic acid copolymer, a malenic acid copolymer, a partially esterified malenic copolymer, etc. as known from Japanese Patent Publications Nos. 54-34327, 58-12577 and 54-25957, and Japanese Unexamined Patent Publications Nos. 59-44615, 59-53836 and 59-71048, and cellulose derivatives having a carboxylic acid group in a lateral chain. Furthermore, a polymer having a hydroxyl group added with a cyclic acid anhydride is useful. Especially pertinent examples of the polymer are copolymers of benzyl acrylate or benzyl methacrylate and acrylic acid or methacrylic acid, and copolymers of a monomer polymerized with benzyl acrylate or benzyl methacrylate and acrylic acid or methacrylic acid, as disclosed in U.S. Pat. No. 4,139,291.

In addition, examples of the under coating layer are the separation layer (having oxygen blocking and peeling abilities), the alkali soluble thermoplatic resin layer and the under coating layer that are disclosed in Japanese Unexamined Patent Publications Nos. 4-208940, 5-80503, 5-173320 and 5-72724.

The photomask material of the present invention comprises at least a photosensitive layer and a temporary substrate formed in this order on a light transmissive substrate or at least a light blocking layer, a photosensitive layer and a temporary substrate formed in this order on a light transmissive substrate. These temporary substrate and photosensitive layer are the same as those used for the photosensitive transfer material described above. As the light transmissive substrate, a glass plate such as, for example, a quartz plate, a soda glass plate, an anhydrous alkali glass plate and a transparent plastic film such as a polyethylene terephthalate film can be employed. The light transmissive substrate is preferred to have a thickness generally in a range from approximately 1 mm to approximately 7 mm but vary according to use of the photomask.

The light blocking layer is preferred to comprise a metal layer or a pigment containing layer. Examples of the metal layer includes a thin chrome film, a bilayer film of low reflecting chrome/chromium oxide, an aluminum layer, an iron oxide, etc. The metal layer may be formed using spattering and is preferred to have a thickness in a range from approximately 0.1 $\mu$m to approximately 0.5 $\mu$m in thickness. On the other hand, preferred as the pigment containing layer is a layer that contains a pigment capable of absorbing light in the range of wavelengths as was previously described and is sensitive to light of a wavelength greater than 405 nm. When using the metal film, for example a chrome film, for the light blocking layer, while the chrome film has high mechanical strength and high durability in itself, the chrome film tends to produce pinholes therein due to cleaning in the process of making a photomask because it is generally used in a thickness less than approximately 0.2 μm. In addition, while a surface reflectance of the light blocking layer relative to light of 435 nm in wavelength is approximately 70% as for a chrome film and from approximately 10% to approximately 20% as for a low reflecting chrome/chromium oxide bilayer film, the problem regarding a decline in resolution occurs due to light reflection of the metal layer when projecting the mask pattern. For this reason, it is effective to leave the photosensitive layer as a protective layer over the light blocking metal layer of the photomask.

The following description will be directed to a process of manufacturing photomasks in which the photomask material or the photosensitive transfer matrial described above is used. In the case of using the photomask material, the process includes at least a step of exposing the photosensitive layer of the photomask material with the temporary substrate peeled apart with light of a wavelength greater than 405 nm and then developing the photomask material. On the other hand, in the case of using the photosensitive transfer material having a photosensitive layer capable of doubling as a light blocking layer, the photosensitive layer is exposed with light of a wavelength greater than 405 nm and then developed. Further, in the case of using the photosensitive transfer material having a metal layer working a light blocking layer, after the temporary substrate is peeled apart from the photosensitive transfer material, the photosensitive layer is exposed and developed as described above, and an exposed portion of the thin metal layer is removed using ordinary etching. The photosensitive layer left on the remaining metal layer is subsequently removed, or otherwise, may be left as a protective layer. The photosensitive layer may be exposed through the temporary substrate in advance, and the temporary substrate is subsequently peeled apart.

In the process of making a photomask using the photosensitive transfer material, after laying the photosensitive transfer material over the light transmissive substrate or the light transmissive substrate with the light blocking metal film formed thereon so that the photosensitive layer contacts the light transmissive substrate or the light blocking metal film, the photosensitive layer is transferred to the transmissive substrate or the light blocking layer and the temporary substrate is subsequently peeled apart from the photosensitive layer. Thereafter, the photosensitive layer is exposed and developed. In the case of using the light transmissive substrate with the light blocking metal film formed thereon, the photosensitive layer after exposure and development is etched to remove unexposed portions of the photosensitive layer if the light blocking metal film is not necessary to be protected by the photosensitive layer.

The phtomask material is exposed preferably with lasers that include, for example, an HeCd laser of a wavelength of 442 nm, an Ar laser of a wavelength of 488 nm or a Nd-YAG laser of a wavelength of 532 nm but are not exclusive to them.

Developing fluids fort the photosensitive transfer material include, for example, an aqueous solution of sodium carbonate, that is especially preferred, hydroxides of alkali metals or alkali earth metals, carbonates of alkali metals or alkali earth metals, hydrogencarbonates, ammonia water, an aqueous solution of tetra alkyl ammonium, etc. but are not exclusive to them.

Etching fluids include, for example, cerium nitrate ammon or perchloic acid for a chrome film and hydrochloric acid for aluminium film, but are not exclusive to them In the process of making a photomask using the photosensitive transfer material, the photosensitive layer over the transmissive substrate may be heated at a heating temperature from approximately 120° C. to approximately 250° C. preferably for from 15 minutes to 60 minutes after exposure thereof in order to enhance its mechanical strength. The thermal treatment at a heating temperature lower than approximately 120° C. is of effect on enhancement of mechanical strength of the photosensitive layer. The thermal treatment may be performed by the use of any conventional device such as a dry oven, a hot plate, etc.

The present invention will be illustrated in more detail by reference to examples of preferred embodiments thereof but not exclusive to the examples.

EXAMPLE I (1) Photosensitive Transfer Material
(a) Alkali-Soluble Resin Layer (Oxygen Blocking Layer and Peeling Layer)

A base layer coated film was prepared by forming an alkali-soluble resin layer of approximately 1.6 μm thickness having the following composition over a polyethylene terephthalate film of 75 μm thickness by the use of a whirler and then drying the alkali-soluble resin layer at a temperature of 120° C. for two minutes.

| Composition of alkali-soluble resin layer | |
|---|---|
| Polyvinyl alcohol (PVA205, distributed by Kurare Co., Ltd) | 10.8 part by weight |
| Polyvinyl pyrrolidone (PVPK30, distributed by GAF Corporation) | 5.0 parts by weight |
| Surface active agent (MEGAFAC F142D, distributed by Dai Nippon Ink & Chemicals Inc.) | 0.24 parts by weight |
| Ion exchange water | 31 parts by weight |
| Methanol | 140 parts by weight |

(b) Photosensitive Layer

A photosensitive transfer material was prepared by coating a photosensitive layer of approximately 3 μm dry thickness having the following composition over the alkali-soluble resin layer coated film by the use of a whirler, drying it at a temperature of 100° C. for three minutes and thereafter laminating a polypropylene film of 6 μm thickness on the photosensitive layer.

| Composition of photosensitive transfer material | |
|---|---|
| Green pigment fluid dispersion | 542.4 part by weight |
| Yellow pigment fluid dispersion | 215.2 parts by weight |
| Binder (methacrylic acid/allylmethacrylate copolymer (polymerization molar ratio 20/80) | 85.3 parts by weight |
| Monomer (DPHA, distribute by Nippon Kayaku Co., Ltd) | 88.5 parts by weight |
| Sensitizing dye (compound I) | 8.2 parts by weight |
| Radical polymerization initiator (Irgacur-784, distributed by Ciba Specialty Chemicals Co., Ltd.) | 15.5 parts by weight |
| Auxiliary sensitizing agent (compound II) | 24.7 parts by weight |
| Surfactant active agent (MEGAFAC F142D, distributed by Dai Nippon Ink & Chemicals Inc.) | 1.0 part by weight |
| MEK 595 | 595 parts by weight |
| PEGMEA | 28 parts by weight |
| Cyclohexane | 758.2 parts by weight |

The compounds I and II are expressed by the following formulas

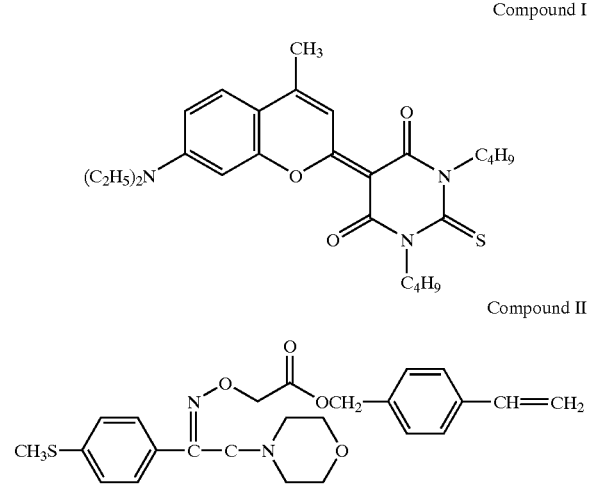

In this instance, the green pigment fluid dispersion was prepared by dispersing 150 parts by weight of a green pigment (Pigment green 7), 100 parts by weight of V259MB (polimarizable alkali soluble binder having a fluorine skeleton:54.3%, distributed by Nippon Steel Chemical Co., Ltd.) and 750 parts by weight of PEGMEA in a dispersing medium. The yellow pigment dispersing liquid was prepared by dispersing 150 parts by weight of a yellow pigment (Pigment yellow 139), 100 parts by weight of V259MB (polimarizable alkali soluble binder having a fluorine skeleton:54.3%, distributed by Nippon Steel Chemical Co., Ltd.) and 750 parts by weight of PEGMEA in a dispersing medium.

(2) Photomask Material

A photomask material was prepared by peeling apart the polypropylene film from the photosensitive transfer material and thereafter attaching the photosensitive transfer material to a glass plate of 2 mm thickness at a temperature of 130° C. under a pressure of 78.4 kPa by the use of a fast-laminator (V-200 distributed by Taisei Laminator Co., Ltd.).

The absorbency of the photosensitive layer of the photosensitive transfer material before exposure is shown by a curve A in FIG. 1. As proved in FIG. 1, the photosensitive layer has an absorbency of 1.10 for a wavelength of 532 nm. In this instance, the photosensitive layer was 3.23 μm in thickness.

(3) Photomask

In order to prepare a photomask, after peeling apart the temporary substrate, more specifically peeling apart the polyethylene terephthalate film from the alkali-soluble resin layer of the photomask material, the photosensitive layer was exposed with YAG laser light of a wavelength of 532 nm through the alkali-soluble resin layer. The exposure sensitivity was approximately 0.4 mJ/cm$^2$. Thereafter, the photomask material was immersed in a bath of an alkali developer (a 20% water solution of TCD distributed by Fuji Photo Film Co., ltd.) at a temperature of 33° C. for 20 seconds, and subsequently rinsed and dried. The developed photomask material was treated with heat at a temperature of 200° C. for 30 minutes so as thereby to be completed as a photomask having the given mask pattern. The absorbency of the photosensitive layer of the photosensitive transfer material, i.e. the light blocking layer of the photomask, after exposure, development and thermal treatment is shown by a curve B in FIG. 1. As proved in FIG. 1, the absorbency of the photosensitive layer was approximately 3.41 for a wavelength of 365 nm, approximately 3.9 for a wavelength of 405 nm, and approximately 2.7 for a wavelength of 435 nm. In this instance, the photomask had 5H pencil hardness and bad solvent resistance that was proved to be not at stake as a result of a smear test with acetone.

In order to assess the image reproducibility of the photomask in practical use, an ultraviolet sensitive resist was exposed through the photomask. Specifically, a positive type photoresist layer of ultraviolet sensitive resist (Positive resist 204LT distributed by Fuji Film Olin Co,. Ltd.) was formed on a glass plate (which was rinsed with a 5% KOH alkali solution and surface treated with hexamethyl disilazene) and finished to a thickness of approximately 3.23 μm. The photoresist layer was exposed to ultraviolet light generated by a 2 Kw high-pressure mercury lamp through the photomask put on the glass plate so as to contact directly with the positive photoresist layer. The exposure was performed under exposure condition of 4 mJ/cm$^2$ using an aligner. After the exposure, the photoresist layer was immersed in a bath of a tetramethyl ammonium hydroxide developer (FHD distributed by Fuji Film Olin Co,. Ltd.) at a room temperature of 23° C. for 45 seconds, and subsequently rinsed and dried. As a result of an examination of the photoresist layer, the mask pattern was satisfactorily transferred to the photoresist layer.

EXAMPLE II (1) Photosensitive Transfer Material (a) Peeling Layer

A peeling layer of approximately 0.7 μm thickness having the following composition was formed over a polyethylene terephthalate temporary substrate of approximately 100 μm thickness and then dried.

| Composition of peeling layer | |
|---|---|
| Methylemethacrylate/2-ethylehexyleacrylate/benzylmethacrylate/methacrylic acid copolymer (polymerization molar ratio: 55/12/5/28, weight-average molecular weight: 95000, Tg: approximately: 73° C.) | 7 parts by weight |
| Styrene/acrylic acid copolymer (polymerization molar ratio: 63/37, weight-average molecular weight: 10000, Tg: approximately 100° C.) | 16.33 parts by weight |
| Compound of bisphenol A with 2 combining weight of octaethylene glycol monomethacrylate dehydration-condensed (BPE-500 distributed by Shin Nakamura Chemical Co., Ltd.) | 10.89 part by weight |
| Fluorine surface-active agent (F176P distributed by Dai Nippon Ink & Chemicals Inc.) | 1.96 parts by weight |
| Methyl ethyl ketone | 508.1 parts by weight |
| Methanol | 13.32 parts by weight |
| Methoxypropanol | 7.44 parts by weight |
| 1-methoxy-2-propylacetate | 231.9 parts by weight |

(b) Oxygen Blocking Layer

An oxygen blocking layer having the following composition was formed over the peeling layer and dried. The dried oxygen blocking layer was approximately 1.6 μm.

| Composition of oxygen blocking layer | |
|---|---|
| Polyvinyl alcohol (PVA205, saponification rate: 80%, distributed by Kurare Co., Ltd) | 21.2 part by weight |
| Polyvinyl pyrrolidone (PVPK30, distributed by GAF Corporation) | 2.35 parts by weight |
| Methanol | 214 parts by weight |
| Distilled water | 262 parts by weight |

(c) Photosensitive Layer

A colored photosensitive transfer material was prepared by forming a colored photosensitive layer of approximately 3 μm thickness over the oxygen blocking layer and further laminating a polypropylene film of 6 μm thickness as a protective layer on the colored photosensitive layer. A coating fluid that for the colored photosensitive layer had the following composition containing green and yellow pigment fluid dispersions.

| Composition of colored photosensitive transfer material | |
|---|---|
| Green pigment fluid dispersion | 36.16 part by weight |
| Yellow pigment fluid dispersion | 35.17 parts by weight |
| Methacrylic acid/allylmethacrylate/benzyl methacrylate copolymer (polymerization molar ratio 28/48/24) | 85.3 parts by weight |
| Dipentaerythritol hexaacrylate (DPHA distribute by Nippon Kayaku Co., Ltd) | 6.04 parts by weight |
| Sensitizing dye (compound I) | 0.45 parts by weight |
| Radical polymerization initiator (Irgacur-784, distributed by Ciba Specialty Chemicals Co., Ltd.) | 1.38 parts by weight |
| Auxiliary sensitizing agent (compound II) | 1.03 parts by weight |
| Hydroquinone monomethyl ether) | 0.003 parts by weight |
| Fluorine surfactant active agent (F176P, distributed by Dai Nippon Ink Co., Ltd.) | 0.021 part by weight |
| Methyl ethyl keton | 70.40 parts by weight |
| 1-methoxy-2-propylacetate | 19.14 parts by weight |

The green pigment fluid dispersion was prepared by dispersing a green pigment having the following composition in a motor mill M-200 (distributed by Eiger Corporation) filled with zirconia beads of 1.0 mm diameter rotating at a peripheral velocity of 9 m/s for five hours.

| Green pigment fluid dispersion | |
|---|---|
| C.I pigment green 7 | 63 part by weight |
| Compound III | 3.15 parts by weight |
| Methacrylic acid/allylmethacrylate/ benzylmethacrylate copolymer (polymerization molar ratio 28/48/24) | 31.5 parts by weight |
| 1-methoxy-2-propylacetate | 352.4 parts by weight |

The yellow pigment fluid dispersion was prepared by dispersing a yellow pigment having the following composition in the same way as the green pigment fluid dispersion.

| Yellow pigment fluid dispersion | |
|---|---|
| C.I pigment yellow 138 | 54 part by weight |
| Compound III | 2.7 parts by weight |
| Methacrylic acid/allylmethacrylate/ benzylmethacrylate copolymer (polymerization molar ratio 28/48/24) | 27.0 parts by weight |
| 1-methoxy-2-propylacetate | 366.3 parts by weight |

The compound III is expressed by the following formula:

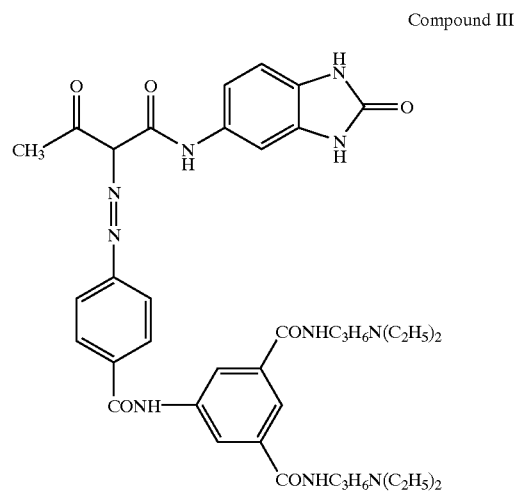

Compound III (2) Photomask Material

A photomask material was prepared by peeling apart the polypropylene film from the photosensitive transfer material and thereafter laminating the photosensitive transfer material to a glass plate (which was rinsed with an alkali solution) at a temperature of 130° C. by the use of a laminator (MDL601 distributed by Muromachi Chemicals Co., Ltd.). Cleaning was performed by immersing the glass plate in an ultrasonic cleaning bath of SEMICOCLEAN SE10 (distributed by Furuuchi Chemicals Corporation) for 15 minutes, and, thereafter, rinsing the glass plate with ion exchange water and drying it at 110° C. for 10 minutes.

(3) Photomask

Figure 2:
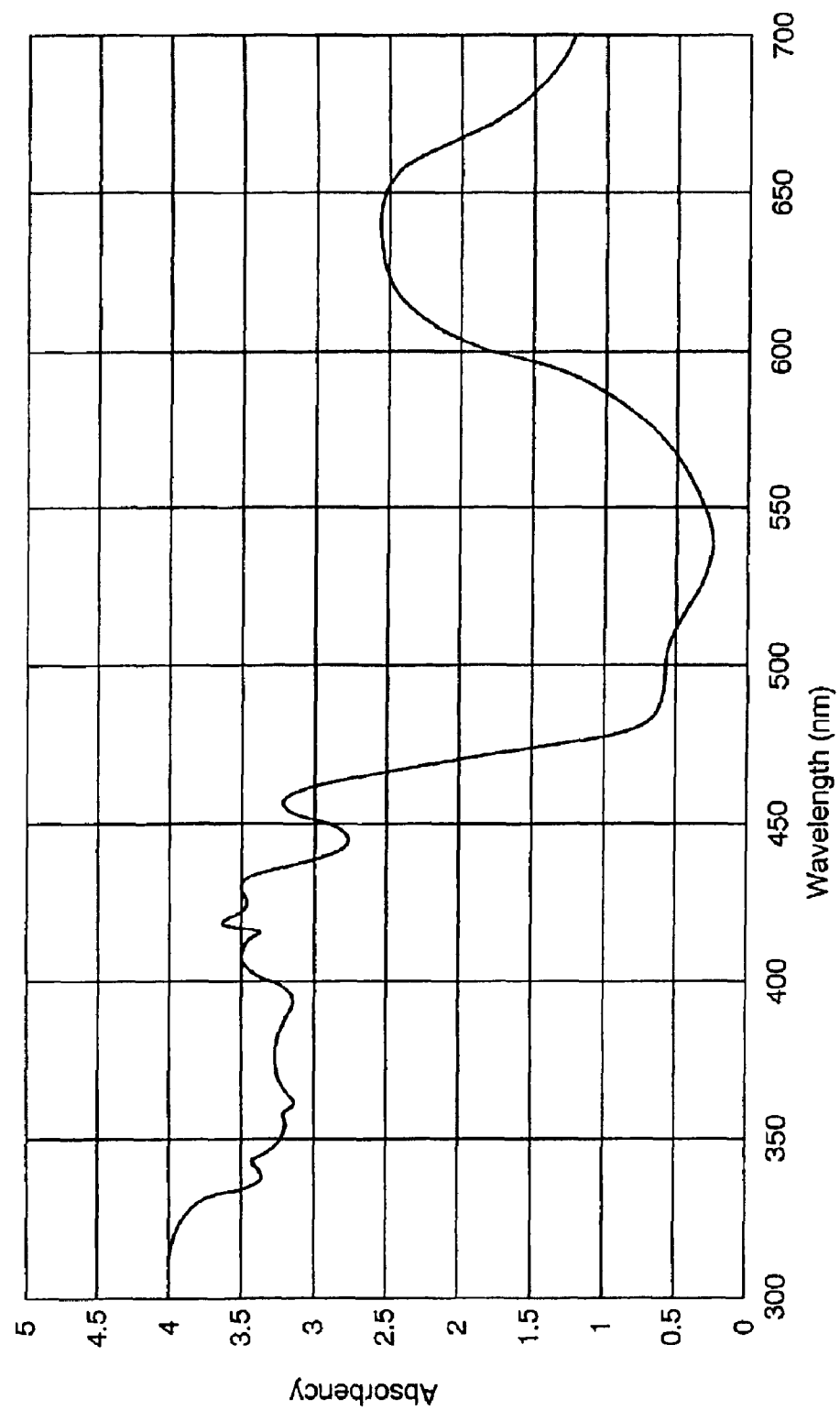
FIG. 2 is graphical representation of absorbency of a light blocking layer of a photomask according to another embodiment of the present invention.

In order to prepare a photomask, after peeling apart the polyethylene terephthalate temporary substrate from the photomask material, the photosensitive layer was exposed with a NdYAG laser having a wavelength of 532 nm by the use of a laser plotter FR7000 (Dai Nippon Screen Co., Ltd) Thereafter, the exposed photomask material was immersed in a bath of an alkali developer (a 10% water solution of TCD distributed by Fuji Photo Film Co., ltd.) at a temperature of 28° C. for 120 seconds, and subsequently rinsed with ion exchange water and dried. The developed photomask material was treated with heat at a temperature of 200° C. for 30 minutes so as thereby to be completed as a photomask having the given mask pattern. FIG. 2 shows the absorbency of the photomask thus provided with respect to wavelength.

The photomask had a line/space resolution of 8 μm/8 μm and an exposure sensitivity of approximately 0.8 mJ/cm². In addition, the photomask had a pencil hardness of 5H and solvent resistance that was proved to be not at stake as a result of a smear test with acetone.

Comparative Example

A comparative photomask was the same as the photomask of EXAMPLE I except to use the following pigment fluid dispersions made of dispersants containing no polymerization group in place of those of Example I and had a line/space resolution of 10 μm/10 μm and an exposure sensitivity of approximately 0.9 mJ/cm².

| Composition of green pigment fluid dispersion | |
|---|---|
| Pigment green 7 | 150 part by weight |
| Methacrylic acid/benzylmethacrylate copolymer (weight-average molar weight 30,000; polymerization molar ratio 28/72, 54.3% PEGMEA solution) | 100 parts by weight |
| PEGMEA | 750 parts by weight |

| Composition of yellow pigment fluid dispersion | |
|---|---|
| Pigment yellow 139 | 150 part by weight |
| Methacrylic acid/benzylmethacrylate copolymer (weight-average molar weight 30,000; polymerization molar ratio 28/72, 54.3% PEGMEA solution) | 100 parts by weight |
| PEGMEA | 750 parts by weight |

The photosensitive layer of the photomask was approximately 3.30 μm in thickness before exposure and 1.11 in absorbency for a wavelength of 532 nm before exposure, approximately 3.39, 3.91 and 2.24 in absorbency for wavelengths of 365 nm, 405 nm and 435 nm, respectively, after exposure, development and thermal treatment. The photosensitive layer of the photomask had a pencil hardness from 3H to 5H and, however, got its surface scratched for a smear test with acetone.

While the invention has been described in detail in conjunction with specific embodiments thereof, it will be apparent to those skilled in the art that various other embodiments and variants can be made without departing from the spirit and scope of the invention.

What is claimed is:

1. A photomask material comprising a transmissive substrate and a photosensitive layer formed on said transmissive substrate, wherein said photosensitive layer is made of a composition comprising at least an alkali-soluble resin binder having polymerizable unsaturated bonds, a monomer having at least one polymerizable unsaturated bond, a photopolymerization initiation system sensitive to light of a wavelength longer than 405 nm and a colorant surface-treated with a polymerizable dispersant.

2. A photomask material as defined in claim 1, wherein said photosensitive layer is formed on a temporary substrate and laminated on said transmissive substrate.

3. A photomask material as defined in claim 2, wherein said temporary substrate has an under layer containing an alkali-soluble resin formed under said photosensitive layer.

4. A photomask material as defined in claim 1, wherein said polymerizable dispersant is alkali soluble.

5. A photomask material as defined in claim 1, wherein said photosensitive layer is such as having a high absorbency in a specific range of wavelengths after exposure and development.

6. A photomask material as defined in claim 5, wherein said photosensitive layer has an absorbent higher than 2.5 in said specific range of wavelengths.

7. A photomask material as defined in claim 5, wherein said absorbency is high in a range of wavelengths shorter than 405 nm.

8. A photomask material as defined in claim 5, wherein said photosensitive layer is sensitive to light in a range of wavelengths longer than 440 nm and has said high absorbency in a range of wavelengths shorter than 380 nm after exposure and development.

9. A photomask material as defined in claim 5, wherein said photosensitive layer has an absorbency less than 2.4 in a range of wavelengths longer than 480 nm before exposure and development and greater than 3 in a range of wavelengths shorter than 380 nm after exposure and development.

10. A photomask material as defined in claim 5, wherein said polymerization initiation system contains a sensitizing dye capable of absorbing laser light of a wavelength longer than 405 nm.

11. A photomask material as defined in claim 1, and further comprising a light blocking layer formed between said transmissive substrate and said photosensitive layer.

12. A photomask having a light blocking mask pattern formed on a transmissive substrate by exposing a photosensitive layer with light of a wavelength longer than 405 nm and then developed, wherein said photosensitive layer is made of a composition comprising at least an alkali-soluble resin binder having polymerizable unsaturated bonds, a monomer having at least one polymerizable unsaturated bond, a photopolymerization initiation system sensitive to light of a wavelength longer than 405 nm and a colorant surface-treated with a polymerizable dispersant and has a high absorbency in a specific range of wavelengths after exposure and development.

13. A photomask as defined in claim 12, wherein said photosensitive layer has an absorbent higher than 2.5 in said specific range of wavelengths.

14. A photomask as defined in claim 12, wherein said absorbency is high in a range of wavelengths shorter than 405 nm.

15. A photomask as defined in claim 12, wherein said photosensitive layer is sensitive to light in a range of wavelengths longer than 440 nm and has said high absorbency in a range of wavelengths shorter than 380 nm after exposure and development.

16. A photomask as defined in claim 12, wherein said photosensitive layer has an absorbency less than 2.4 in a range of wavelengths longer than 480 nm before exposure and development and greater than 3 in a range of wavelengths shorter than 380 nm after exposure and development.

17. A photomask as defined in claim 12, wherein said photosensitive layer has an absorbency less than 2.4 in a range of wavelengths longer than 480 nm before exposure and development and greater than 3 in a range of wavelengths shorter than 380 nm after exposure and development.

18. A photomask having at least a light blocking mask patter formed on a transmissive substrate and a protective layer formed on said light blocking mask pattern by exposing a photosensitive layer with light of a wavelength longer than 405 nm and then developed, wherein said photosensitive layer is made of a composition comprising at least an alkali-soluble resin binder having polymerizable unsaturated bonds, a monomer having at least one polymerizable unsaturated bond, a photopolymerization initiation system sensitive to light of a wavelength longer than 405 nm and a colorant surface-treated with a polymerizable dispersant.

19. A photomask as defined in claim 18, wherein said photosensitive layer has an absorbent higher than 2.5 in said specific range of wavelengths.

20. A photomask as defined in claim 18, wherein said absorbency is high in a range of wavelengths shorter than 405 nm.

21. A photomask as defined in claim 18, wherein said photosensitive layer is sensitive to light in a range of wavelengths longer than 440 nm and has said high absorbency in a range of wavelengths shorter than 380 nm after exposure and development.

22. A photomask as defined in claim 18, wherein said photosensitive layer has an absorbency less than 2.4 in a range of wavelengths longer than 480 nm before exposure and development and greater than 3 in a range of wavelengths shorter than 380 nm after exposure and development.

23. A photomask as defined in claim 18, wherein said photosensitive layer has an absorbency less than 2.4 in a range of wavelengths longer than 480 nm before exposure and development and greater than 3 in a range of wavelengths shorter than 380 nm after exposure and development.

24. A photomak as defined in claim 18, wherein said light blocking layer comprises a metal layer.

25. A process of manufacturing a photomask comprising at least the steps of laminating a photosensitive layer formed on a temporary substrate on a transmissive substrate with said photosensitive layer faced to said transmissive substrate; exposing said photosensitive layer to light of a wavelength longer than 405 nm either before or after peeling said temporary substrate apart from said photosensitive layer; and then developing said photosensitive layer; wherein said photosensitive layer is made of a composition comprising at least an alkali-soluble resin binder having polymerizable unsaturated bonds, a monomer having at least one polymerizable unsaturated bond, an photopolymerization initiator sensitive to light of a wavelength longer than 405 nm and a colorant surface-treated with a polymerizable dispersant.

26. A process of manufacturing a photomask as defined in claim 25, wherein said transmissive substrate is coated with a metal layer on which said photosensitive layer is laminated and which is etched after said step of developing said photosensitive layer.

27. A process of manufacturing a photomask as defined in claim 25, wherein said temporary substrate is light transmissive when said step of peeling said temporary substrate apart from said photosensitive layer after said step of exposing said photosensitive layer.

28. A process of manufacturing a photomask as defined in claim 25, wherein said photosensitive layer is exposed to a laser light of a wavelength longer than 405 nm.

29. A process of manufacturing a photomask as defined in claim 25, and further comprising the step of heating said photosensitive layer after said exposure at a temperature between approximately 120° C. and approximately 250° C.

30. A process of manufacturing a photomask as defined in claim 25, wherein said temporary substrate has an under layer containing an alkali-soluble resin formed under said photosensitive layer.

31. A process of manufacturing a photomask as defined in claim 25, wherein said polymerizable dispersant is alkali soluble.

32. A process of manufacturing a photomask as defined in claim 25, wherein said photosensitive layer is such as having a high absorbency in a specific range of wavelengths after exposure and development.

33. A process of manufacturing a photomask as defined in claim 25, wherein said photosensitive layer has an absorbent higher than 2.5 in said specific range of wavelengths.

34. A process of manufacturing a photomask as defined in claim 25, wherein said absorbency is high in a range of wavelengths shorter than 405 nm.

35. A process of manufacturing a photomask as defined in claim 25, wherein said photosensitive layer is sensitive to light in a range of wavelengths longer than 440 nm and has said high absorbency in a range of wavelengths shorter than 380 nm after exposure and development.

36. A process of manufacturing a photomask as defined in claim 25, wherein said photosensitive layer has an absorbency less than 2.4 in a range of wavelengths longer than 480 nm before exposure and development and greater than 3 in a range of wavelengths shorter than 380 nm after exposure and development.

* * * * *